United States Patent
Horie et al.

(10) Patent No.: US 9,315,014 B2
(45) Date of Patent: *Apr. 19, 2016

(54) SCREEN PRINTING APPARATUS

(71) Applicant: Panasonic Intellectual Property Management Co., Ltd., Osaka (JP)

(72) Inventors: Isao Horie, Yamanashi (JP); Yusuke Sueyasu, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/706,357

(22) Filed: May 7, 2015

(65) Prior Publication Data

US 2015/0321465 A1    Nov. 12, 2015

(30) Foreign Application Priority Data

May 12, 2014    (JP) .................................. 2014-098350

(51) Int. Cl.
| | |
|---|---|
| *B41F 15/20* | (2006.01) |
| *H05K 3/12* | (2006.01) |
| *B41F 15/08* | (2006.01) |
| *B41F 15/26* | (2006.01) |
| *H05K 13/00* | (2006.01) |

(52) U.S. Cl.
CPC .............. *B41F 15/20* (2013.01); *B41F 15/0818* (2013.01); *B41F 15/26* (2013.01); *H05K 3/1216* (2013.01); *H05K 13/0069* (2013.01); *H05K 2203/0165* (2013.01)

(58) Field of Classification Search
CPC ...... B41F 15/20; B41F 15/26; B41F 15/0818; B41F 15/0881; H05K 3/1216; H05K 13/0069; H05K 2203/0165; H05K 2203/082

See application file for complete search history.

(56) References Cited

U.S. PATENT DOCUMENTS

| | | | |
|---|---|---|---|
| 6,598,292 B1 * | 7/2003 | Segawa et al. .................. | 29/852 |
| 2010/0291289 A1 * | 11/2010 | Kim ............................. | 427/98.4 |
| 2014/0215813 A1 * | 8/2014 | Kishimoto ...................... | 29/739 |

FOREIGN PATENT DOCUMENTS

JP    2003-224395 A    8/2003

* cited by examiner

*Primary Examiner* — Blake A Tankersley
(74) *Attorney, Agent, or Firm* — Pearne & Gordon LLP

(57) ABSTRACT

In a screen printing apparatus, a squeegee is slid on a mask contacting a board to print paste onto the board via pattern holes formed in the mask. The screen printing apparatus includes: a box-like member including a top-plate portion in which first suction hole and a second section hole are formed and which is allowed to contact the board; a blower suction pipe communicating with an internal space of the box-like member and extending outside the box-like member; a blower suction source sucking air through the blower suction pipe to generate a blower suction force in the first suction hole; a vacuum suction pipe connected to the second suction hole and extending through the internal space to an outside of the box-like member; and a vacuum pressure supplying device supplying a vacuum pressure to the second suction hole through the vacuum suction pipe.

3 Claims, 6 Drawing Sheets

SCREEN PRINTING APPARATUS

CROSS-REFERENCES TO RELATED APPLICATION(S)

This application is based on and claims priority from Japanese Patent Application No. 2014-098350 filed on May 12, 2014, the entire contents of which are incorporated herein by reference.

BACKGROUND

1. Field of the Invention

One or more embodiments of the present invention relate to a screen printing apparatus in which a squeegee is slid on a mask contacting a board to print paste onto the board via pattern holes formed in the mask.

2. Description of Related Art

In a screen printing apparatus, in order to prevent the board from being positionally misaligned with a mask, the board is held using vacuum suction. For example, in an electronic component mounting apparatus described in JP-A-2003-224395, suction holes are formed in a member which is allowed to contact the lower surface of a board, the holes are connected with vacuum suction pipes, and a vacuum pressure is supplied to the vacuum suction pipes.

SUMMARY

However, in the configuration where a board is held by vacuum suction, when leakage is caused due to deformation of the board such as warpage, the suction force is largely reduced, and the force of holding the board is weakened, which may cause a printing failure.

An object of one or more embodiments of the invention is to provide a screen printing apparatus which can suppress a printing failure due to deformation of a board such as warpage.

In an aspect of the invention, there is provided a screen printing apparatus in which a squeegee is slid on a mask contacting a board to print paste onto the board via pattern holes formed in the mask, the screen printing apparatus including: a box-like member including a top-plate portion in which first suction hole and a second section hole are formed and which is allowed to contact a lower surface of the board; a blower suction pipe which communicates with an internal space of the box-like member, and which extends outside the box-like member; a blower suction source which sucks air through the blower suction pipe to generate a blower suction force in the first suction hole; a vacuum suction pipe which is connected to the second suction hole, and which extends through the internal space of the box-like member to an outside of the box-like member; and a vacuum pressure supplying device which supplies a vacuum pressure to the second suction hole through the vacuum suction pipe.

According to an aspect of the invention, it is possible to suppress a printing failure due to deformation of a board such as warpage.

DETAILED DESCRIPTION

Figure 1:
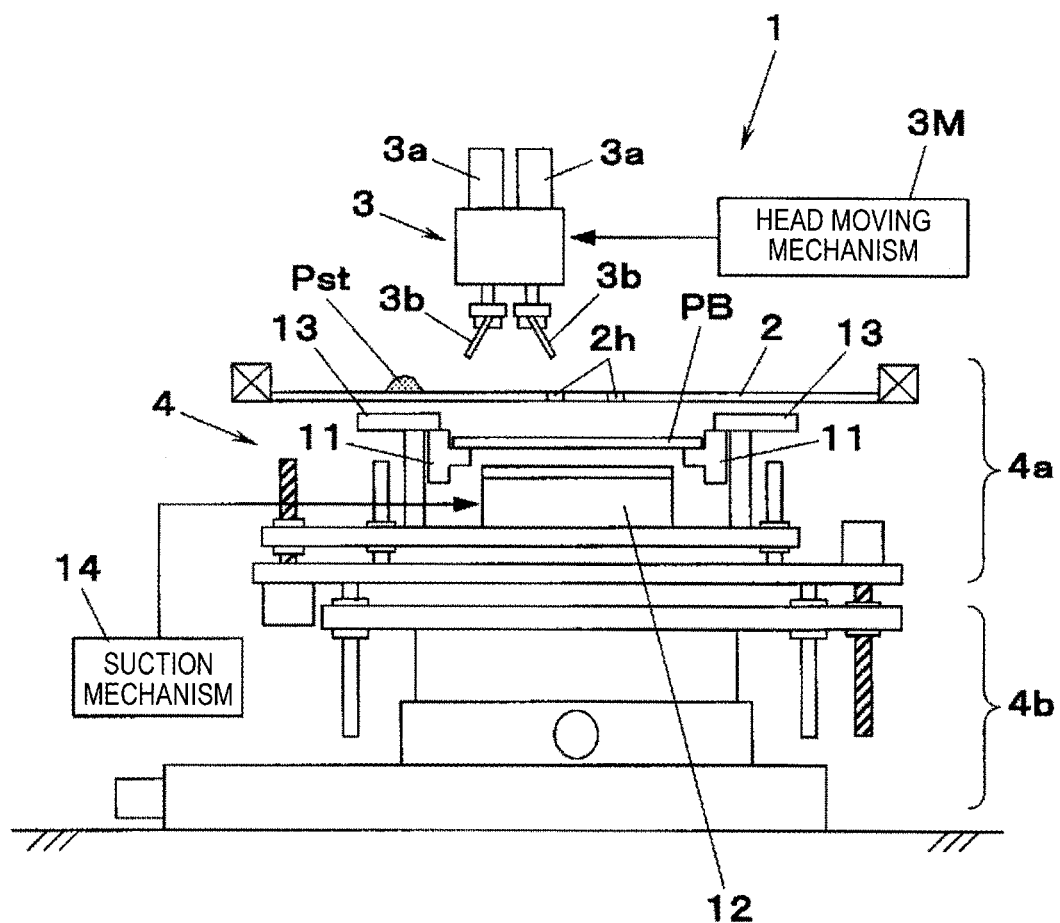
FIG. 1 is a side view of a screen printing apparatus of an embodiment of the invention.

Hereinafter, an embodiment of the invention will be described with reference to the drawings. FIG. 1 shows a screen printing apparatus 1 of an embodiment of the invention. The screen printing apparatus 1 includes a mask 2, a squeegee head 3, and a board holding/moving unit 4. A controlling device 5 controls operations of components of the screen printing apparatus 1 (See FIG. 2).

The mask 2 is held in a horizontal attitude, and paste Pst is supplied to the upper surface of the mask. Pattern holes 2h corresponding to the electrode arrangement of a board PB are formed in the mask 2. The squeegee head 3 includes a squeegee 3b which is raised and lowered by a squeegee lifting cylinder 3a. The squeegee head 3 is driven by a head moving mechanism 3M to be horizontally moved.

The board holding/moving unit 4 includes a board holding mechanism section 4a which holds the board PB, and a moving mechanism section 4b which moves the board holding mechanism section 4a in the horizontal direction and in the vertical direction. The board holding mechanism section 4a includes a transport conveyor 11, an under-supporting box 12, a clamper 13, and a suction mechanism 14. The board PB positioned by the transport conveyor 11 is supported from the lower side by the upper surface of the under-supporting box 12. The clamper 13 clamps the board PB which is supported from the lower side by the under-supporting box 12, from the lateral side. The suction mechanism 14 sucks the board PB which is supported from the lower side by the under-supporting box 12, to hold the board PB to the upper surface of the under-supporting box 12.

Figure 3:
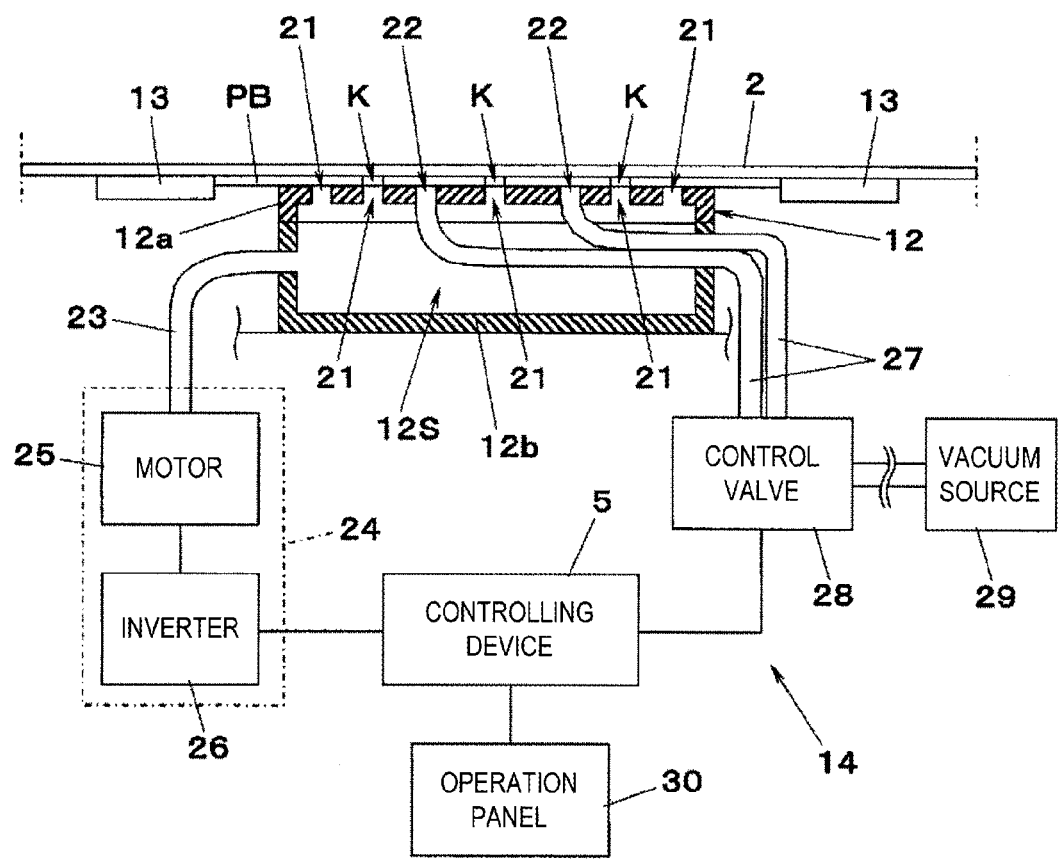
FIG. 3 is a diagram of an under-supporting box and suction mechanism which are provided in the screen printing apparatus of the embodiment of the invention.
Figure 4:
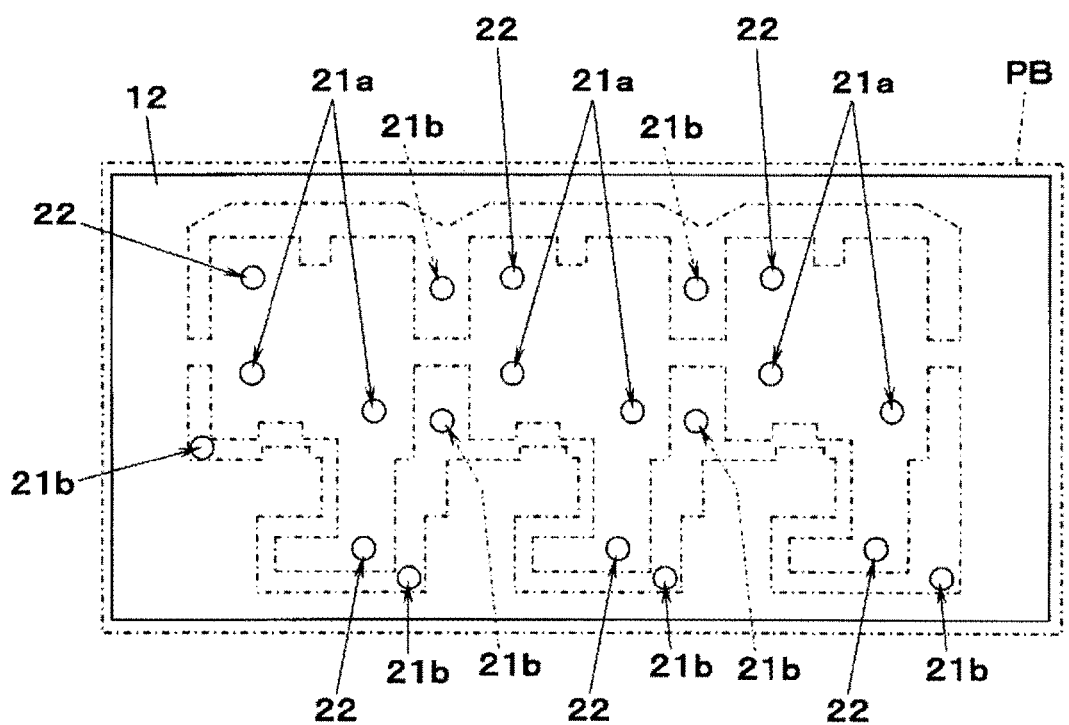
FIG. 4 is a plan view of the under-supporting box of the screen printing apparatus of the embodiment of the invention.

Referring to FIG. 3, the under-supporting box 12 which serves as an example of a box-like member includes a top-plate portion 12a of which the upper surface is allowed to contact the lower surface of the board PB, and a supporting section 12b which holds the top-plate portion 12a. The top-plate portion 12a is attachable to and detachable from the supporting section 12b. A plurality of first suction holes 21, and a plurality of second suction holes 22 are formed in the top-plate portion 12a. The first suction holes 21 are holes for sucking the board PB and the mask 2 by means of a blower. Therefore, at least one of the first suction holes 21 is formed at positions opposing the lower surface of the board PB clamped by the clamper 13, and the other of the first suction holes 21 is formed at positions opposing cutaway portions K of the board PB (see also FIG. 4). In FIG. 4, the first suction holes 21 formed at positions opposing the lower surface of the board PB are denoted by the reference numeral 21a, and the first suction holes 21 formed at positions opposing the cutaway portions K of the board PB are denoted by the reference numeral 21b. By contrast, the second suction holes 22 are holes for vacuum sucking the board PB. Therefore, the second suction holes 22 are formed at positions which oppose the lower surface of the board PB clamped by the clamper 13 but do not oppose the cutaway portions K of the board PB clamped by the clamper 13 (see also FIG. 4).

The suction mechanism 14 includes a blower suction pipe 23, a blower suction source 24, a plurality of vacuum suction pipes 27, and a control valve 28. Referring to FIG. 3, the blower suction pipe 23 communicates with the internal space 12S of the under-supporting box 12, and extends outside the under-supporting box 12. The blower suction source 24 is connected to the blower suction pipe 23. The blower suction source 24 includes a motor 25 which sucks the air through the blower suction pipe 23 to generate a blower suction force in the first suction holes 21, and an inverter 26 which changes the frequency of the power source supplied to the motor 25 to change the number of rotations of the motor 25.

Referring to FIG. 3, the vacuum suction pipes 27 are connected respectively to the second suction holes 22 from the side of the lower surface of the top-plate portion 12a. The vacuum suction pipes 27 extend through the internal space 12S of the under-supporting box 12 and an opening in the side surface of the under-supporting box 12 (the opening is sealed) to the outside of the under-supporting box 12. The plurality of vacuum suction pipes 27 are connected to a vacuum source 29. The control valve 28 is interposed between the vacuum suction pipes 27 and the vacuum source 29. The control valve 28 is operated by the controlling device 5 so as to control the vacuum pressure which is supplied to the vacuum suction pipes 27 from the vacuum source 29. The control valve 28 serves as an example of a vacuum pressure supplying device which supplies the vacuum pressure to the second suction holes 22 through the vacuum suction pipes 27.

Figure 2:
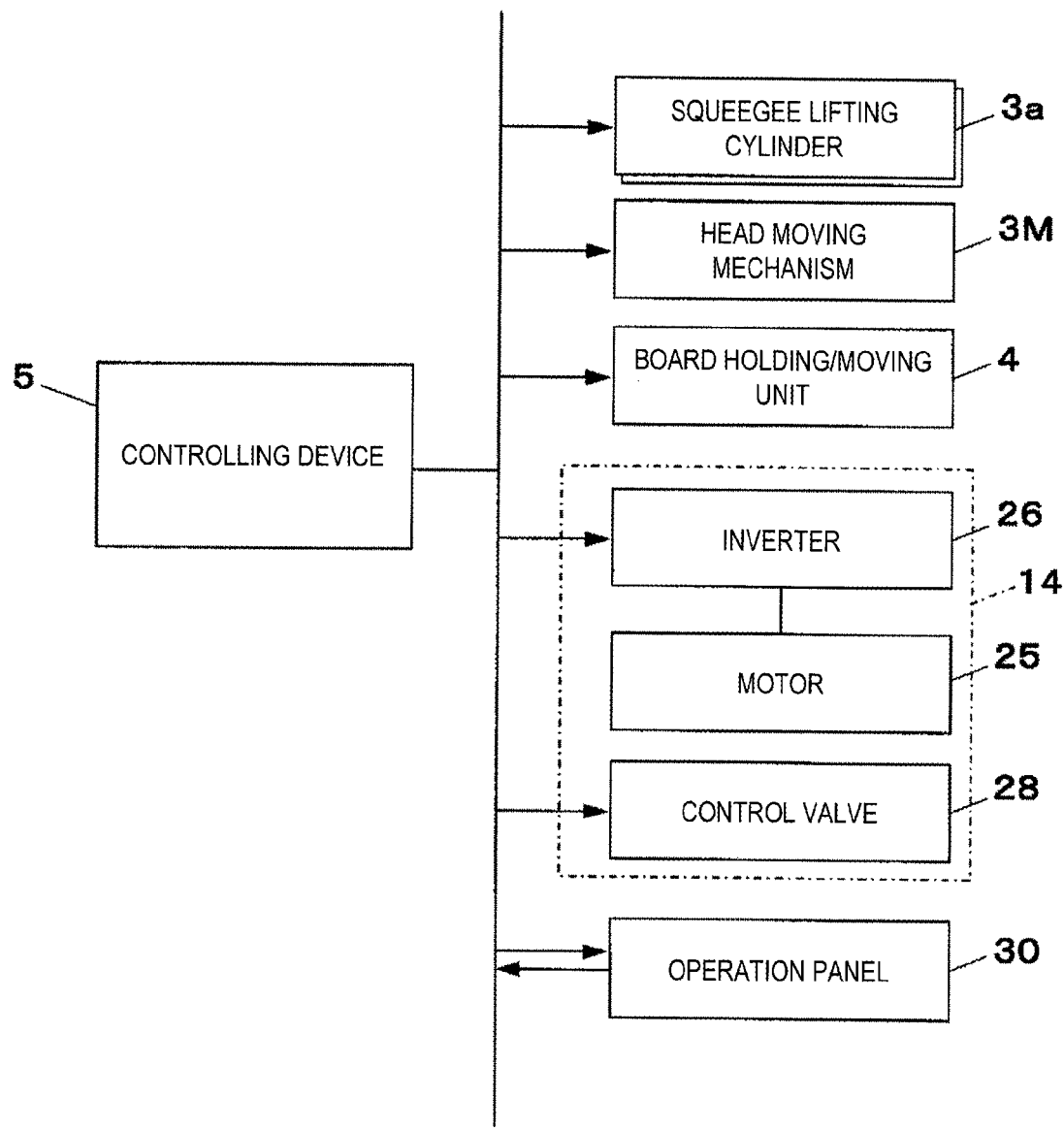
FIG. 2 is a block diagram showing a controlling system of the screen printing apparatus of the embodiment of the invention.
Figure 5:
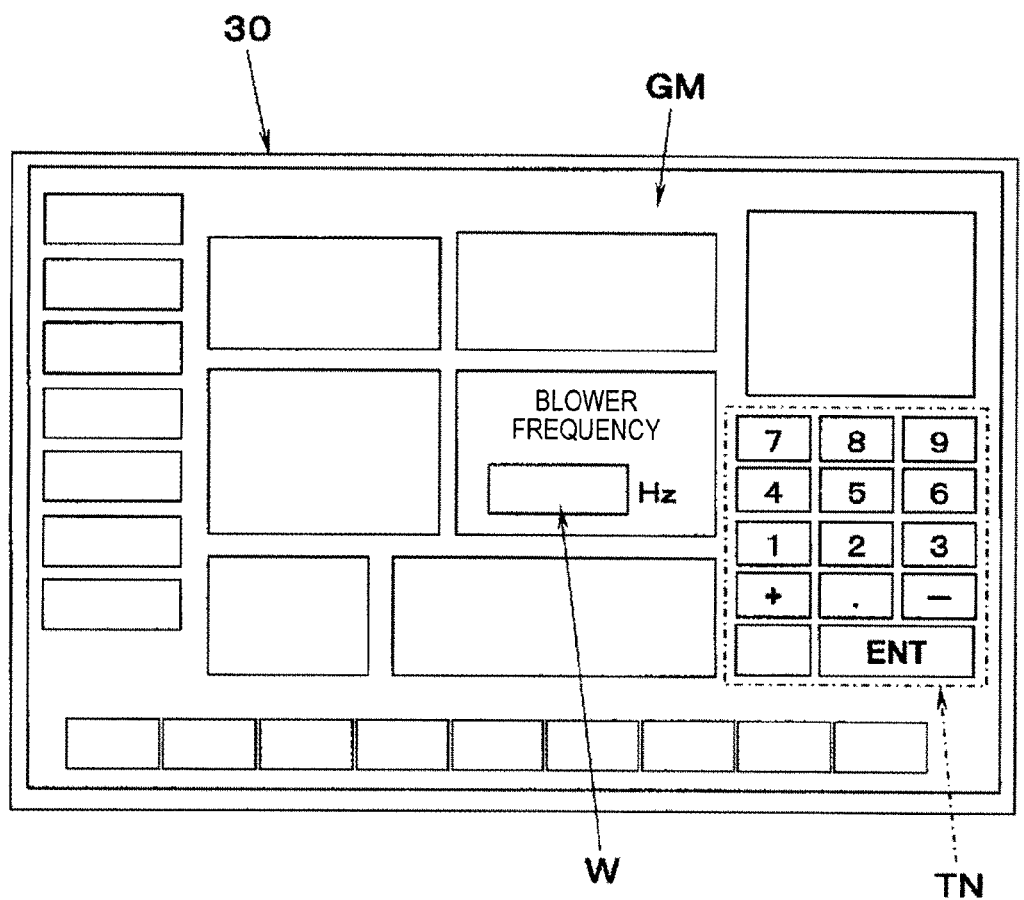
FIG. 5 is a view showing an example of an operation screen displayed on an operation panel of the screen printing apparatus of the embodiment of the invention.

Referring to FIGS. 2 and 3, an operation panel 30 is connected to the controlling device 5. As shown in FIG. 5, for example, an operation screen GM for adjusting (setting and changing) the number of rotations of the motor 25 through the inverter 26 is displayed on the operation panel 30. When the worker performs an operation of changing the frequency of the power source supplied to the inverter 26, on the operation screen of the operation panel 30, the number of rotations of the motor 25 is changed, and therefore the suction flow rate (blower flow rate) of the air flowed through the first suction holes 21 is changed, and the suction force exerted on the board PB and the mask 2 is increased or decreased. In the example shown in FIG. 5, when a desired frequency value is input into the column W of "BLOWER FREQUENCY" of the operation screen GM through a numerical input button group TN including a numeric keypad, the power source frequency of the inverter 26 is set.

To print the paste Pst onto the board PB by the screen printing apparatus 1, first, the transport conveyor 11 transports the board PB and positions it at a predetermined position. Then, the under-supporting box 12 supports the board PB from the lower side, and the clamper 13 clamps the board PB.

Figure 6:
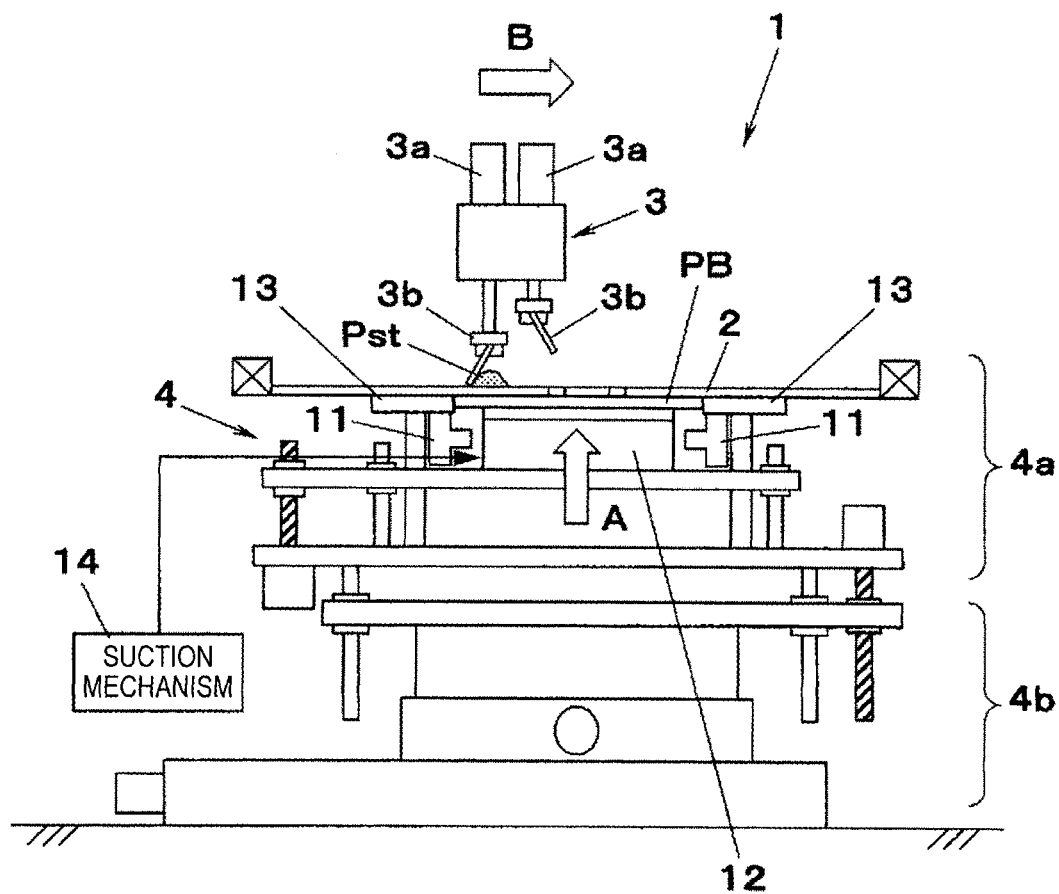
FIG. 6 is a side view of the screen printing apparatus of the embodiment of the invention.

After the board PB is clamped by the clamper 13, the moving mechanism section 4b moves the board holding mechanism section 4a to cause the board PB to contact the mask 2 so that the electrodes of the board PB coincide with the pattern holes 2h of the mask 2 (the arrow A in FIG. 6). When the board PB contacts the mask 2, the suction mechanism 14 operates to suck the board PB and the mask 2 via the first suction holes 21 by the blower, and vacuum suck the board PB via the second suction holes 22. The board PB is vacuum sucked via the second suction holes 22, and in addition sucked via the first suction holes 21 by the blower. Even in the case where deformation such as warpage occurs in the board PB and a vacuum suction force is insufficiently exerted, therefore, the board PB is firmly held against the upper surface of the under-supporting box 12. Also the mask 2 is sucked via the first suction holes 21 by the blower. Even in the case where there is warpage in the mask 2, therefore, the warpage is eliminated, and the mask 2 closely contacts the board PB.

The lager the number of rotations of the motor 25, the higher the flow rate of the blower. Therefore, the degree of close contact between the mask 2 and the board PB is increased. When the flow rate of the blower is excessively high, however, excessive "bleeding" of the paste Pst which is sucked by the blower to the side of the lower surface of the mask 2 via the pattern holes 2h of the mask 2 occurs, and there is a possibility that a printing failure may be caused. Therefore, the worker previously checks the number of rotations of the motor at which a printing failure is caused (the number is referred to as "critical rotation number"), and sets the number of rotations of the motor 25 through the inverter 26 (i.e., sets the frequency of the power source supplied to the motor 25) so that the number of rotations of the motor 25 is not higher than the critical rotation number, whereby a printing failure due to bleeding of the paste Pst can be prevented from occurring. In the embodiment, the setting of the number of rotations of the motor 25 through the inverter 26 can be easily performed via the operation panel 30, and therefore the operability is excellent.

When the board PB and the mask 2 are sucked, the squeegee 3b is lowered to butt against the upper surface of the mask 2. Then, the squeegee head 3 is moved in the horizontal direction (the arrow B shown in FIG. 6) to cause the squeegee 3b to be slid on the mask 2. Therefore, the paste Pst on the mask 2 is scraped by the squeegee 3b, and printed onto the board PB via the pattern holes 2h of the mask 2.

After the paste Pst is printed onto the board PB, the moving mechanism section 4b lowers the board holding mechanism section 4a to separate the board PB from the mask 2. When the board PB is separated from the mask 2, the suction mechanism 14 cancels the suction of the board PB and the mask 2. Furthermore, the clamper 13 is opened to cancel the clamping of the board PB, and the transport conveyor 11 transports the board PB to the outside of the screen printing apparatus 1, thereby completing the screen printing of one board PB.

In the screen printing apparatus 1 of the embodiment, as described above, the blower suction and the vacuum suction are combinedly used for holding the board PB, and the board PB is sucked by both the vacuum suction and the blower suction. Even in the case where deformation such as warpage occurs in the board PB and a vacuum suction force is insufficiently exerted, therefore, a strong force of holding the board PB can be maintained, and a printing failure due to deformation such as warpage of the board PB can be suppressed from occurring. Even in the case where warpage is formed in the mask 2, the warpage is corrected by sucking the mask 2 by the blower, and the degree of close contact between the mask 2 and the board PB is enhanced. Therefore, also paste printing suitable for high-density mounting can be performed.

In the embodiment, the top-plate portion 12a is detachably disposed, and can be replaced with another one. Therefore, any kinds of boards PB can be correspondingly supported from the lower side and held by suction. Instead of the detachable top-plate portion 12a as described in the embodiment, the under-supporting box 12 as a whole may be replaceable, which can provide similar effects.

As described above, one or more embodiments of the present invention can provide a screen printing apparatus which can suppresses a printing failure due to deformation of a board such as warpage.

What is claimed is:

1. A screen printing apparatus in which a squeegee is slid on a mask contacting a board to print paste onto the board via pattern holes formed in the mask, said screen printing apparatus comprising:
- a box-like member comprising a top-plate portion in which first suction hole and a second section hole are formed and which is allowed to contact a lower surface of the board;
- a blower suction pipe which communicates with an internal space of the box-like member, and which extends outside the box-like member;
- a blower suction source which sucks air through the blower suction pipe to generate a blower suction force in the first suction hole;
- a vacuum suction pipe which is connected to the second suction hole, and which extends through the internal space of the box-like member to an outside of the box-like member; and
- a vacuum pressure supplying device which supplies a vacuum pressure to the second suction hole through the vacuum suction pipe.

2. The screen printing apparatus according to claim 1, wherein the box-like member is replaceable.

3. The screen printing apparatus according to claim 1, wherein the top-plate portion of the box-like member is replaceable.

* * * * *